United States Patent [19]

Dumas

[11] 3,879,744

[45] Apr. 22, 1975

[54] BIDIRECTIONAL THYRISTOR

[75] Inventor: Guy H. Dumas, Paris, France

[73] Assignee: Silec-Semi-Conducteurs, Paris, France

[22] Filed: Nov. 27, 1973

[21] Appl. No.: 419,465

Related U.S. Application Data

[63] Continuation-in-part of Ser. No. 268,944, July 5, 1972, abandoned.

[30] Foreign Application Priority Data

July 6, 1971 France .............................. 71.24729

[52] U.S. Cl. ...................... 357/39; 357/20; 357/68; 357/86

[51] Int. Cl. ........................................... H01l 11/10

[58] Field of Search .......... 317/235 AB; 357/20, 37, 357/39, 68, 86

[56] References Cited

UNITED STATES PATENTS

| | | | |
|---|---|---|---|
| 3,360,696 | 12/1967 | Neilson et al. | 317/235 |
| 3,443,171 | 5/1969 | Knott et al. | 317/234 |
| 3,681,667 | 8/1972 | Kokosa | 317/235 R |
| 3,696,273 | 10/1972 | Foster | 317/235 R |
| 3,739,242 | 6/1973 | Foster | 317/235 R |
| 3,787,719 | 1/1974 | Anderson | 317/235 R |

*Primary Examiner*—Andrew J. James
*Assistant Examiner*—Joseph E. Clawson, Jr.
*Attorney, Agent, or Firm*—Sughrue, Rothwell, Mion, Zinn & Macpeak

[57] ABSTRACT

A gate controlled bi-directional semi-conductor device is described as comprising a first gate controlled bidirectional thyristor of pre-determined switching sensitivity and having first and second current carrying electrodes and a gate control electrode, a second gate controlled bidirectional semi-conductor switching device of relatively less switching sensitivity and having first and second current carrying electrodes and a gate control electrode, a means coupling a first current carrying electrode of said first device through said gate electrode of said second device for controlling the switching of said second device, and a means coupling the second electrode of said first device with the second electrode of said second device whereby upon the application of an operating potential between the first and second electrodes of said second device a current, which is to be controlled, flows initially in said first device and provides a gate controlled current which causes the switching of said second device into conduction.

8 Claims, 10 Drawing Figures

BIDIRECTIONAL THYRISTOR

CROSS REFERENCE TO RELATED APPLICATION

This application is a continuation-in-part application of application Ser. No. 268,944 filed July 5, 1972, now abandoned.

BACKGROUND OF THE INVENTION

1. Field of the Invention

The present invention relates to gate controlled bi-directional semi-conductors which are known as triacs and which provide increased switching possibilities.

2. Description of the Prior Art

A triac is a device comprising three electrodes (two main electrodes and a control electrode) consisting of five semi-conductor layers doped alternately in type P and type N. In a triac, the arrangement of the five layers is such that it may be compared to a unit integrating two thyristors conducting in opposite directions: the cathode of one thyristor being connected to the anode of the other and vice-versa. As this device only comprises one control electrode, this latter is able, by injecting a small electric current, to switch the tirac from a blocked state (high impedance) to a conducting state (low impedance), this being in one of the two possible conduction directions between the two main electrodes.

In general terms, if the main electrode of a triac is designated by A1, its second main electrode by A2 and its gate G, taking reference of the potential at the electrode A1, four modes of polarization will be determined as represented in table 1 provided below.

TABLE 1

| Mode of Polarization | Polarity of A1 | Polarity of A2 | Polarity of the Gate with respect to A1 |
|---|---|---|---|
| 1st Quadrant I+ | − | + | + |
| I− | − | + | − |
| 3rd Quadrant III+ | + | − | + |
| III− | + | − | − |

For a triac, one of its important desirable qualities is this possibility of triggering according to the four polarization modes with similar sensitivities. This is especially useful when the triac is used in industry as it enables the triac to be triggered with a given polarity order signal irrespective of the relative polarities of the main electrodes A1 and A2.

Of the essential characteristics necessary for a triac are its non-commutating dV/dt behavior, its dI/dt behavior and its commutating dV/dt. The commutating dV/dt is a specific problem of the triac. If the triac is considered as equivalent to two thyristors, at the end of the conducting phase of one thyristor, the charges are transferred to the second and in the case of high dV/dt commutation speeds, this second thyristor which is polarized in a manner to give direct blockage may be triggered at the wrong time if there is no control voltage at the gate of the triac.

Numerous prior art devices have been produced to improve one or the other of these characteristics. The processes for improving the dV/dt commutation characteristic of a triac are best known and consist essentially in partially short circuiting the outer layers of the triac. However as far as the triggering according to the four modes and the triggering sensitivity, the commutating dV/dt and the dI/dt behavior, are concerned, the prior art shows that the improvement of one of these characteristics is provided at the expense of one of the others. For example, U.S. Pat. No. 3,681,667 (Kokosa) describes a device in which an improvement in the dI/dt characteristic is obtained, but which is only capable of being triggered according to two polarization modes and where the commutating dV/dt characteristics are not improved.

SUMMARY OF THE INVENTION

The object of the present invention is to provide a bi-directional controlled device capable of operating according to the four polarization modes and in which the commutating dV/dt may be considerably increased.

A further object of the present invention is to provide a device which is no more complicated to manufacture than a triac device of the prior art.

To attain these aims and others, the present invention proposes a device comprising five layers doped alternately and having a new structure which may be considered as a combination of two elementary triacs. The features of the present invention will be described in more detail with reference to the accompanying drawings.

DESCRIPTION OF THE PREFERRED EMBODIMENTS

Figures 1, 2:
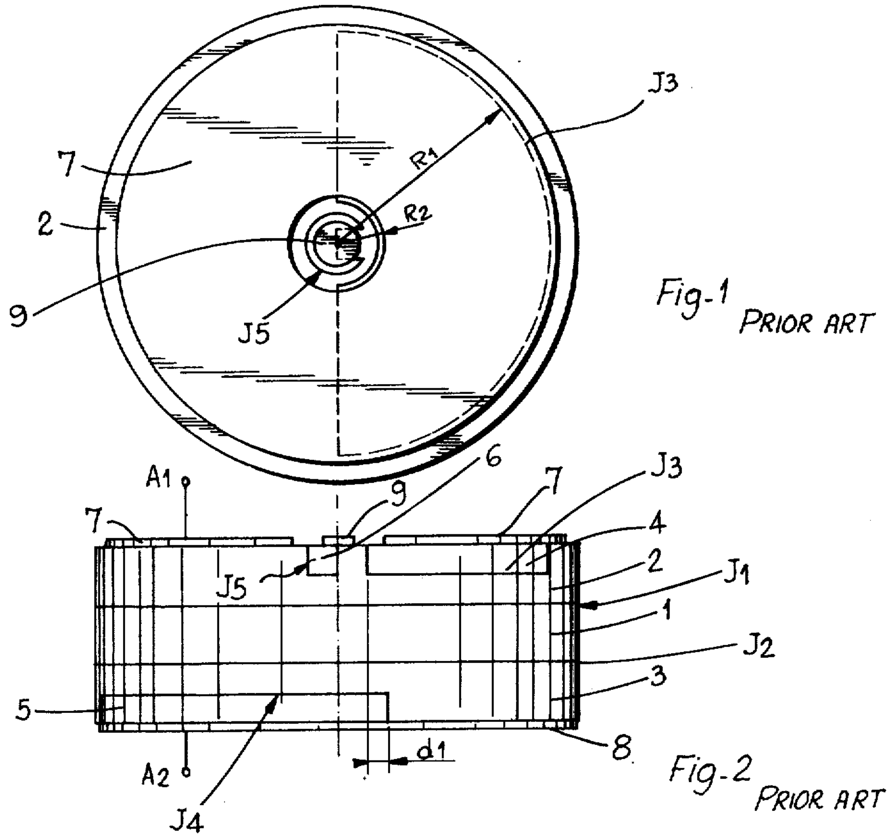
Fig-1 PRIOR ART, Fig-2 PRIOR ART
FIGS. 1–3 represent a view from above, a front view and a view from below of a prior art device which is described to better illustrate the objects of the present invention.
Figure 3:
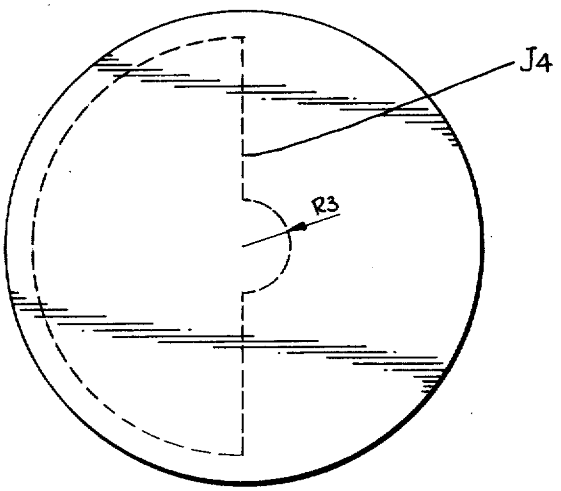
Fig.3 PRIOR ART

Referring now to FIGS. 1—3, a prior art device will now be described which constitutes a first attempt to obtain a triac capable of triggering in the four modes of polarization and having an improved commutating dV/dt. A device of this type is described in U.S. Pat. No. 3,696,273 (Foster). This device comprises a circular-shaped and semi-conductor body having an inner n-type zone 1 situated between first and second outer p-type zones 2 and 3 extending at first and second opposite sides of the body and forming p-n junctions $J_1$ and $J_2$ respectively with the inner n-type zone 1. A second further n-type zone 4 forms a p-n junction $J_3$ with the first outer p-type zone 2. Referring to FIG. 1, this semi-circular layer 4 is comprised between two semi-circles with radii R1 and R2, R1 being greater than R2. The centers of these two semi-circles coincide with the axis of the semi-conductor body. A third further n-type zone 5 forms a p-n junction $J_4$ with the second outer p-type zone 3. This layer 5 is represented as a projection in FIG. 3. This projection essentially comprises a first semi-circle having the same radius $R_1$ as the layer 4 and, in addition, a semi-circle with a radius $R_3$ slightly greater than the radius $R_2$ mentioned above forms a projection on the median part of this first semi-circle. This projection is again centered on the axis of the semi-conductor body. Thus this projection has a complementary form to that of the hollow in the radius $R_2$ provided in the layer 4 and as is apparent from FIG. 2, in projecting, partial overlapping occurs between the two layers 4 and 5, defined by a distance $d_1 = 3 - R_2$. On the outer face of the layer 2, a fourth n-type layer 6 is provided which forms a junction $J_5$ with this layer 2. The form of the layer 2, as is apparent from FIG. 1, is substantially that of a C. This layer is disposed substantially coaxial to the layers 4 and 5, the concave part of C being directed towards the layer 4.

A control electrode 9 in the form of a disc is in ohmic contact with the layers 2 and 6, so as to short circuit the junction $J_5$ inside the C. On the first outer face an electrode 7 is disposed which is in ohmic contact with the layer 2 and with the layer 4. This electrode is circular in shape and does not short-circuit the junction J3 on the diameter $R_2$, (that is, the inner diameter of this circular electrode is greater than $R_2$). The second outer face is covered by an electrode 8 in ohmic contact with the layers 3 and 5. The first electrode 7 constitutes the terminal $A_1$ of the triac and the second electrode 8 constitutes the terminal $A_2$ of the triac. The assembly which has been described with reference to FIGS. 1, 2 and 3, constitutes two p-n-p-n type structures disposed in parallel, but mounted in reverse order between the two electrodes 7 and 8. In other words, this assembly constitutes two p-n-p-n structures enabling the current to be conducted alternately in opposite directions. The electrode 9 controls the passage to the conductive state of the device by the application of a small current. This device permits triggering according to the modes I+, I−, III+ and III− as defined above. In the case of the device represented in FIGS. 1–3 and described in the Foster patent, it is essential that the n-type layers 4 and 5 overlap in the proximity of the gate, this overlapping being defined by the distance $d_1$. This overlap enables current to be conducted into the mode III+ with an appropriate sensitivity. However, in providing this overlap another problem arises. The devices described may be considered as the integration of two anti-parallel thyristors which share the same n-type base, that, is passage of current between the first and second main current carrying electrodes in the first quadrant is through the n-p-n-p thyristor structure and passage of current between the first and second main current carrying electrodes in the third quadrant is via the p-n-p-n thyristor structure. In operation, at the end of an on state current conduction interval for a given thyristor, the other one is found to be forward biased. The commutation from a conductive to a non-conductive condition is severely limited by the stored charge in the shared n-type base zone in the region of overlap of the outer n-type emitter zones on opposite sides of the body because if the commutating speeds dI/dt and d0/dt are too high this available charge will switch the other thyristor structure from the non-conductive to the conductive state. For this reason, the commutating speeds must be kept low. The ratings could be improved if the periphery of the outer n-type emitter zones on opposite sides of the body were separated so that no overlap was present. However, it is a basic requirement for the operation of the devices that the overlap is present. Therefore a compromise has to be made in determining the amount of overlap in order to provide reasonable commutation speed capability and sensitive turn-on control in the various modes of operation. Particularly, the overlap is essential for operation of the device in the III+ mode.

One of the compromise solutions in the Foster patennt consists in reducing the density of the current between the overlapping n-type regions and in allowing this overlap zone between the n-type emitters of the thyristors to be visible only in the proximity of the gate. The device according to the present invention which is designed to provide a triac having an improved performance over the prior art devices will now be described. This improvement consists in that according to the present invention this device is not subject to any loss of triggering sensitivity for the four possible triggering modes and that a further improved commutating dV/dt is obtained using the structure according to the present invention.

Figure 4:
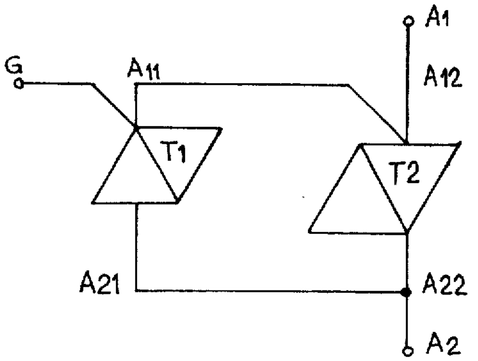
FIG. 4 represents a discrete triac assembly which is provided to illustrate one aspect of the present invention.

Referring to FIG. 4, a schematic diagram designed to illustrate certain features of the present invention invention will be described by way of example only. FIG. 4 represents an assembly comprising two triacs T1 and T2. The triac $T_1$ comprises the main electrodes A1$_1$ and A2$_1$. The triac $T_2$ comprises the main electrodes A1$_2$ and A2$_2$. The main electrode A1$_1$ of the triac $T_1$ is connected to the gate of the triac T2. The main electrode A2$_1$ of the triac $T_1$ is connected to the main electrode A2$_2$ of the triac $T_2$. This assembly comprises three terminals, a main terminal A1 which is the electrode A1$_2$ of triac $T_2$, a main terminal A2 which is the main electrode A2$_2$ of triac T2 and a gate terminal G which is the gate of triac T1.

The triac T1 is selected in such a way that it is responsive for the four triggering modes described above. It will be noted that any current flowing betwee the main electrodes of the triac T1 is injected into the gate of triac T2, in other words, when the triac T1 is triggered, the latter can excite the triac T2, the triggering current of T2 being the main current of T1 and this main current being derived from the load circuit.

The switching mechanism will now be described in more detail, bearing in mind that the triac T2 is less sensitive than the triac T1 and it only conducts current into the modes I+ and III− defined above. When the assembly as a whole is in the blocked state, the electrode A1$_1$ is substantially at the same potential as the electrode A1$_2$, that is, the terminal A1. Electrode A2$_1$ is at the same potential as the electrode A2$_2$, that is, as the terminal A2. If the potential of the terminal A1 is negative and that of the terminal A2 is positive, the triac T1 can be triggered into the modes I+ and I−, the voltage between the terminals A1$_1$ and A2$_1$ then having a very low value and the positive potential of the terminal $A_2$ is practically applied to the electrode of the gate of $T_2$. The triac $T_2$ is thus polarized in the mode I+ while the assembly comprising the two triacs triggers into the modes I+ and I−.

If the potential of the terminal A1 is positive and that of the terminal A2 is negative, the triac T1 may be triggered into the modes III− and III+. In this event, the voltage between the terminals A1$_1$ and A2$_1$ has a very low value and the potential of the terminal A2 is applied to the electrode of the gate of T2. The triac T2 is thus polarized in the mode III− while the assembly of the two triacs is triggered into the modes 111+ and 111−. Thus with two triacs mounted as shown in FIG.

4, as assembly forming a triac capable of being triggered according to the four modes of polarization, with a triac T1 capable of being triggered according to the four modes and a triac T2 capable of being triggered according to two modes only, is obtained. This is represented in the following table.

TABLE 2

| Mode for the two triac assembly | Mode for T1 | Mode for T2 |
|---|---|---|
| I+ | I+ | I+ |
| I− | I− | I+ |
| III+ | III+ | III− |
| III− | III− | III− |

From the preceding statements it is apparent that the sensitivity of the assembly to excitation is conditioned essentially by the sensitivity of the triac $T_1$, and that the triac $T_2$ does not need to be able to be triggered according to the modes, I− and III+. As a result, the triac T2 may be a triac which has a very high commutating dV/dt. Referring to FIGS. 1–3 of the prior art, the layers 4 and 5 may have no overlap and even posses completely separate projections and, as is well known in the prior art, this absence of overlap of the projecting layers 4 and 5 enables a high dV/dt behavior to be obtained.

In order for the device comprising the T1 and T2 triacs connected as shown in FIG. 4 to have a very high commutating dV/dt, two conditions must be fulfilled. Firstly, T1 must not be conductive upon termination of a conduction phase of the device. In fact the dV/dt which it will then possess will be non-commutating dV/dt. This condition is effectively fulfilled since as soon as T2 is excited, the voltage falls between the electrodes A1 and A2 to a very low value, generally on the order of a volt (for example 1.5 V). The voltage at the terminals of the main electrodes of T1 is returned to a level lower than the voltage at the terminals of the main electrodes of $T_2$, the difference being the low input voltage of the triac T2 between $A1_1$ and $A_2$ (on the order of 0.6 – 0.7 V). The voltage at the terminals of the triac T1 then become too low for it to remain conductive.

Secondly, the triac 2 must not reinject charges towards the triac T1 at the moment of commutation. This is rendered possible by the fact that the necessary connections between the triacs T1 and T2 are situated solely at the level of the main electrodes of the triac T1 and not at the level of a semi-conductive layer.

Figure 5:
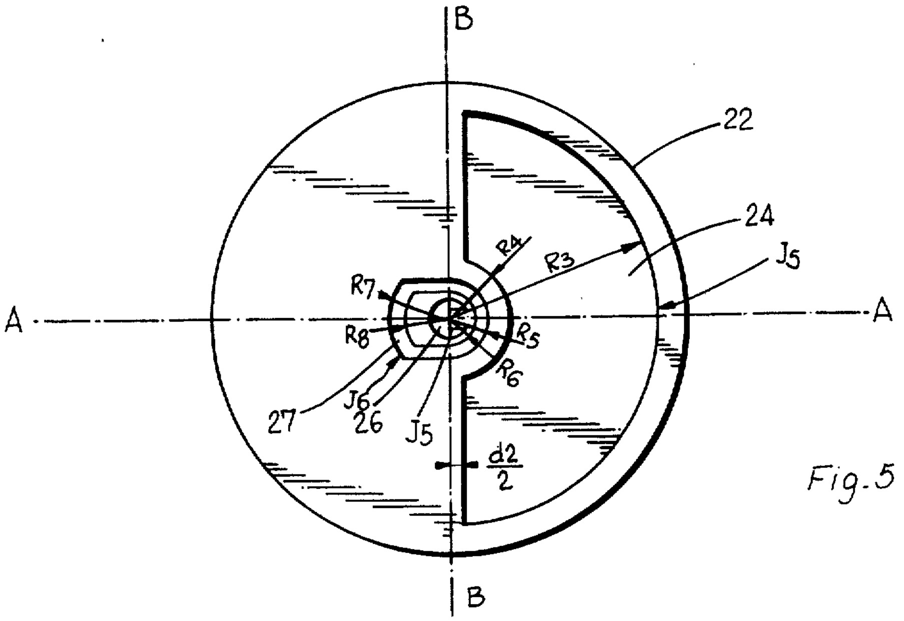
FIGS. 5–7 represent a sectional view from above, a front view and a view from below of an embodiment of a device according to the present invention.
Figure 6:
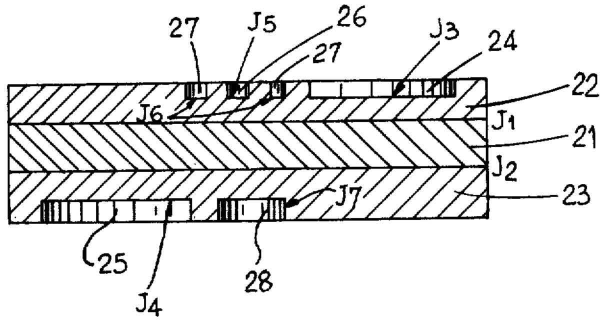
Figure 7:
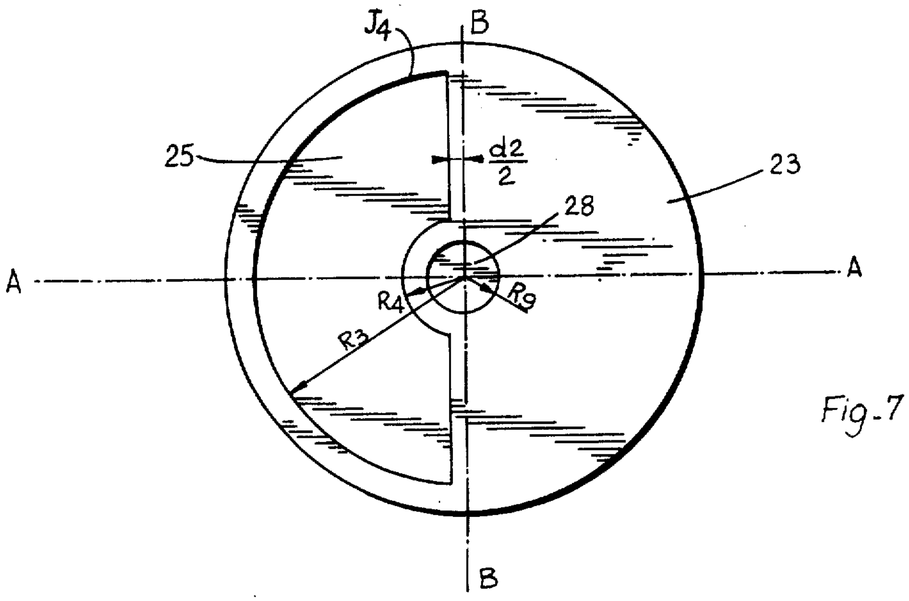

Referring to FIGS. 5 – 10, a preferred embodiment of the invention will now be described. FIGS. 5 – 7 which represent respectively a view from above, a sectional front view along the line A — A of FIG. 5 and a view from below showing an embodiment of the present invention not comprising electrodes so that the shape of the different layers may be discerned more easily. This device consists of a small semi-conducting plate in the form of a disc comprising an n-type inner zone 21 and on either side of this zone 21, p-type diffused zones 22 and 23 forming p-n junctions J1 and J2 respectively with the inner zone 21. Further $n^+$-type outer zones 24 and 25 are disposed on the faces opposite to the plate and form p-n junctions $J_3$ and $J_4$ respectively with the p-type outer zones 22 and 23. An $n^+$-type diffused gate zone 26 is centrally arranged on the upper face of the body to form a p-n junction J5 with the p-type outer zone 22. On this same upper face, an $n^+$-type diffused zone 27 completely surrounds the layer 26 to form a junction J6 with the p-type outer layer 22. On the other face opposite to the gate zone, an $n^+$-type diffused zone 28 is centrally arranged to form a junction J7 with the outer layer 23.

The junctions J1 and J2 extend over the entire surface of the semi-conducting plate and terminate on the lateral surfaces of the same. These lateral surfaces are preferably bevelled so that the junction planes are inclined with respect to the lateral suffaces. This is not shown in FIG. 6 to simplify the diagram. The diffused zones 24 and 25 (represented in FIGS. 5 and 7 respectively) are comprised between two semi-circles with an inside radius R4 and an outside radius R3, these semicircles being arranged so as to be concentric and coaxial with respect to the faces of the semi-conductor body. They are disposed on either side on their respective face with respect to the diametrical BB′ of the semi-conductor. Furthermore, as will be apparent from a comparison of FIGS. 5 and 7, a distance d2/2 is provided between the diametrical plane BB′ and the edge of the semicircles so that they do not overlap where they project. The $n^+$-type gate zone 26 is substantially in the form of a C oriented so that its concave part opens towards the zone 24.

Zone 27 completely surrounds zone 26 so that the fraction of the zone 27 from the side intersected by the diametrical plane BB′ and comprising the layer 24 is semi-circular and has an outer radius R5 and an inner radius R7, these radii being taken from the axis of the semi-conducting plate. This zone continues on the other side of the diametrical plane BB′ perpendicular to this plane until it connects with the ends of an annular fraction centered on the axis of the semi-conducting body, the outer radius R7 of which is substantially equal to the value of R4 defining the inside radius of the semi-circles defining in part diffused zones 24 and 25. The said annular fraction of zone 27 has an inside radius R8 less than R7 but greater than the radius of zone 26.

The $n^+$-type diffused zone 28 is in the shape of a circular disc disposed coaxially with respect to the semiconductor body and comprising a radius R9.

In addition, an important feature of the present invention concerns the realative values of the radii R4–R9 from the axis of the wafer. In particular, R7 is substantially equal to R4, R5 and R8 are substantially equal. R9 is greater than R6, but smaller than R5. The amount of the difference between R4 ad R5 is 0.2–0.7mm and the difference between R9 and R6 is on the order of 0.2–1mm. By way of example, the following values which satisfy the above relationships may be selected for a circular semi-conductor plate in the form of a disc approximately 20mm in diameter and 0.3mm thick:

TABLE 3

| R3 | R4 | R5 | R6 | R7 | R8 | R9 |
|---|---|---|---|---|---|---|
| 6 | 2.5 | 1.6 | 1 | 2.5 | 1.6 | 1.3 |

Figure 8:
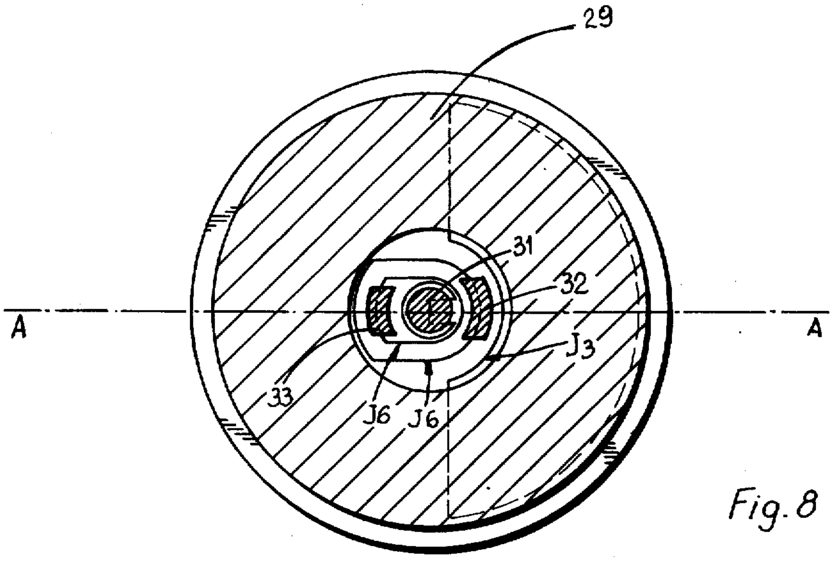
FIGS. 8 and 9 represent a view from above and a sectional front view of the same embodiment of the invention comprising electrodes.
Figure 9:
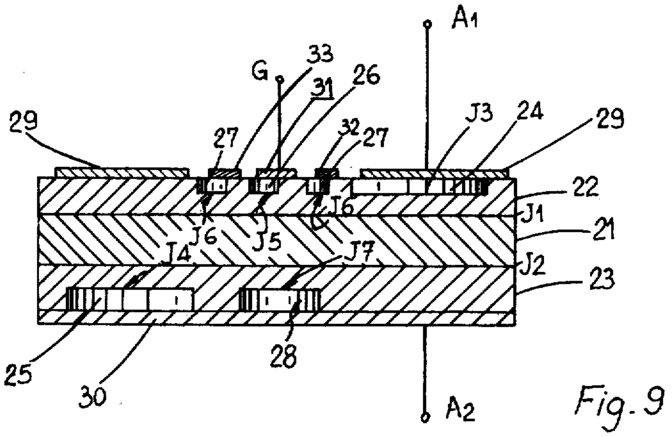

Referring to FIGS. 8 and 9 which represent respectively a view from above and a sectional front view of a preferred embodiment of the present invention, the structure of the conducting contact elements disposed on the outer faces of the device will now be described.

The electrode assembly comprises a circular first electrode 29 disposed on the upper face and forming an ohmic contact with the p-type outer zone 22 and the other n+-type outer zone 24. This electrode is coaxial to the semi-conductor. Its inner diameter is greater than R4 so as not to short circuit the junction J3 along the region defined by the semi-circle with radius R4. The outer radius of this electrode 29 is slightly larger than the radius R3 of the layer 24. A second main electrode 30 in the form of a disc forms on the inner face of the device an ohmic contact common to the outer p-type zone 23 and to the other $n^+$-type outer zones 25 and 28. A gate electrode 31 in the form of a disc centered on the axis of the device forms a common ohmic contact between the $n^+$-type gate zone 26 and the p-type outer zone 22 by short circuiting the junction J5 in the concave region of zone 26 defined above.

Two additional metalizations 32 and 33 are provided. The metalization 32 locally short circuits the junction J6 on a fraction of the arc of the circle defined above by the radius of R5, this metalization forming an ohmic contact on the parts of the layers 27 and 22 disposed on either side of this fraction of the junction J6. The metalization 33 locally short circuits the junction J6 on a fraction of the arc of the circle defined above by the radius R8, this metalization forming an ohmic contact on the part of the layers 27 and 22 disposed on either side of this fraction of the junction J6.

The terminals A1, A2 and G connected respectively to the metal 29, 30 and 31 represented in FIG. 9 are the connections required for utilization of the device. The terminals A1, A2 and G have the normal function of three connections of a conventional triac.

Figure 10:
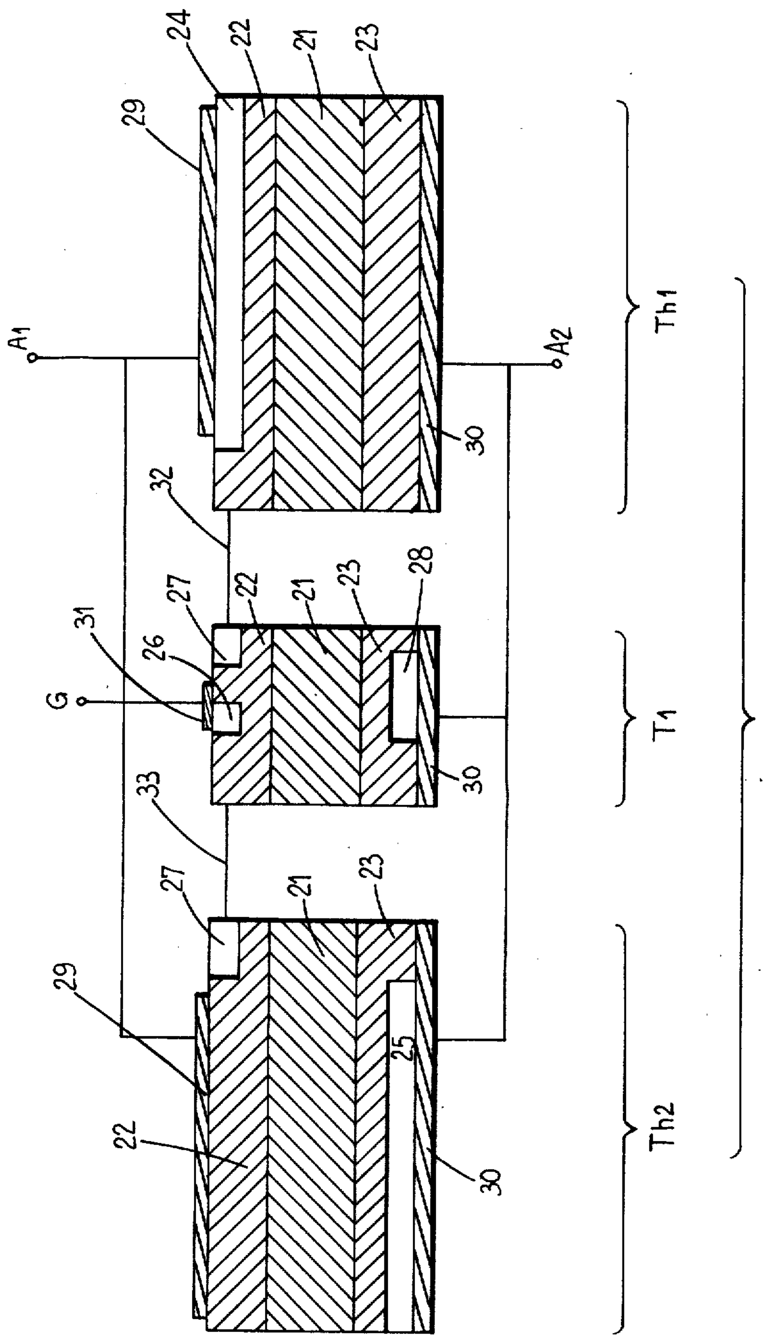
FIG. 10 is a wiring diagram designed to illustrate the method of operation of the present invention.

To illustrate the principle of the invention, FIG. 10 represents an exploded view of FIG. 9 giving a clear picture of the different elements provided in the integrated device according to the present invention. FIG. 10 also provides a better idea of the relationship of the device according to the present invention and the wiring diagram of FIG. 4. In FIG. 10, the same reference represent the same elements as those in FIG. 9. It will be noted that in this FIG. 10 the metalizations 32 and 33 described above are represented diagrammatically by conducting wires connecting the zones 27 and 22. The central element indicated by the reference T1 constitutes an embodiment of the triac represented in FIG. 4. The two outer elements represent respectively a first thyristor Thl and a second thyristor Th2. This unit corresponding to the triac T2 of FIG. 4.

In the device according to the present invention, when alternating power is switched between the terminals A1 and A2, a current is able to pass when the terminal A1 is negative with respect to the terminal A2 by passing through the n-p-n-p structure of the thyristor Th1 formed by the zones 24, 22, 21 and 23 and when the electrode A1 is positive with respect to the terminal A2, a current can pass in the opposite direction with respect to the preceding one through the p-n-p-n structure of this thyristor Th2 formed by the zones 22, 21, 23 and 25. When referring to FIGS. 5–9, it was noted that $n^+$-type zones 24 and 25 are placed on the opposite faces of the semi-conductor so as not to give rise to any overlapping between them even in the region of the gate. It is even preferable to keep the layers 24 and 25 relatively far apart with respect to each other. In projection this spacing indicated by the distance d2 has a value on the order of 0.5 mm in a preferred embodiment of the invention. It thus follows that the two thyristors Th1 and Th2 together provide a bi-directional conduction assembly. Owing to the fact that the layers 24 and 25 do not overlap, this assembly cannot be triggered into the mode III+, but this unit comprising the two thyristors Th1 and Th2 must nevertheless have a considerably improved commutating dV/dt. In fact, the space provided between the thyristors Th1 and Th2 at the n-type layers 24 and 25 prevents reinjection of the charges of the one across the other.

When no triggering order has been supplied to the gate G and the unit is non-conductive, if the electrode A1 has a higher potential than the electrode A2, the thyristor Th1 is in a reversed blocking state. The contact 33 is at a potential very close to that of the contact 29. If a positive or negative triggering current is injected into the metalization 31, the thyristor with a remote gate situated between the contacts 30 and 33 and comprising the layers 28, 23, 21 and 22 will be excited, its main current flowing from 33 towards 30. In this way, the current is injected by the contact 33 at the n+-type layer part 27 which is adjacent to it, this layer portion 27 forming the remote gate of the thyristor Th2 constituted by the layers 25, 23, 21 and 22, the thyristor Th2 will then be excited, the gate current of Th2 then being negative.

In the same manner, when the device is initially blocked and the electrode A2 is at a potential above that of the electrode A1, the thyristor Th2 is in a reversed blocking state and the thyristor Th1 in a direct blocking state. The contact 32 is at a potential very close to that of the contact 29. If a positive or negative triggering current is injected into the metalization 31, the thyristor situated between the contacts 32 and 30 comprising the layers 27, 22, 21 and 23, will be excited, its main current flowing from 30–32. This current is injected by the contact 32 into the p-type layer part which is adjacent to it, this layer part 22 forming the gate of the thyristor Th1 constituted by the layers 24, 22, 21, 23. The thyristor Th1 will thus be excited with a positive triggering current.

It should also be noted that the provision of a layer 27 completely surrounding in a continuous manner the layer 31 and partially short-circuited by the metalizations 32 and 33 is necessary for the first thyristor constituting the triac T1 and formed by the layers 28, 23, 21 and 22 situated between the contacts 30 and 33 to be excited by a positive or negative triggering current and for the second thyristor constituting the triac T1 and comprising the layers 27, 22, 21 and 23, between the contacts 30 and 32 to be excited by a positive or negative triggering current, that is, so that the triac T1 can be excited according to the four polarization modes.

To prevent switching of conduction from the thyristor Th1 to the thyristor Th2 or vice-versa, one of these thyristors reinjects the charge towards the layer parts defining the triac T1 within the integrated unit. The present invention provides the following features of the device represented in FIGS. 5–9:

The $n^+$-type layer 28 is spaced apart from the similar type of layer 25 by a certain distance (on the order of 0.5 mm in a preferred embodiment). Separation is provided by the layer 23 and the contact 30 short circuiting the junction J7 on the outer lower face and the junction J4 on the outer lower face. These short circuits and the spacing between the layers 25 and 28 prevent any coupling by transfer of transversal charge.

In projection the layers 27 and 25 have a minimal overlapping or covering surface, this covering may even be zero which results in desensitization to the triggering of the thyristor Th2. A zero covering of this type represents a preferred embodiment of the present invention.

In a preferred embodiment, the $n^+$-type layer 27 is spaced apart from the similar type layer 24 by a distance on the order of 0.5mm. This part is filled up by the layer 22 which results in the provision of a path for the current lines across the layer 22 between the contacts 32 and 29, thus creating an electrical layer resistance between the contacts 32 and 29. According to the present invention, the value of this resistance has an important function. It is relatively small-in the order of a few ohms (1–10 ohms in a preferred embodiment) and is defined by the spacing between the layers 24 and 27, the distribution of the doping in the layer 22 and the geometrical dimensions of the assembly. The presence of this resistance and the spacing of the layers 27 and 24 prevents reinjection of the charges of the thyristor Th1 towards the triggering region of the gate, that is, towards the region in which the integrated unit constitutes the triac T1.

Another aspect of the present invention is that the device described may be manufactured on the lines of triac devices known in the prior art and in particular, in a similar manner to the structure described in FIGS. 1–3. The fundamental operations involved in the manufacture of the device shown in FIGS. 5–9 will now be described with respect to a preferred embodiment. The semi-conductor body is an n-type silicon disc having a high resistance (on the order of 50 ohms per cm). It is approximately 0.3 mm thick and 20 mm in diameter. The faces of the disc are rendered parallel by grinding. The first diffusion stage is effected on the two faces of the semi-conductor body, the impurity diffused being of the acceptor type, for example, gallium, and forming the p-type regions 22 and 23 and the junctions J1 and J2. The thickness of the layers 22 and 23 is in the order of 50–80 microns. A silicon oxide layer is then pressed onto the two faces of the semi-conductor body to a thickness of a micron. In this silicon oxide layer apertures are opened by any known process at the points where $n^+$-type diffusion is to take place. These techniques are known in the art. The diffusion of n-type doping (phosphorus or arsenic, for example) is effected by applying more donor impurities than acceptor impurities in the regions where the $n^+$-type regions have to be produced, the diffusion depth being on the order of 20 microns.

The contact 30 may be an alloyed contact on an aluminum-silicon eutectic base. This alloy is used for the ohmic resistance between the semi-conductor crystals and a body having a dilatation coefficient suited to the latter, such as molybdenum or tungsten.

The contacts and the metalization 29, 31, 32 and 33 are produced at the same time. For example, this may be effected by depositing aluminum in a thickness of 5–10 microns on the upper surface of the device by evaporation. Annealing may be carried out at a temperature lower than that of the aluminumsilicon eutectic base to ensure sufficient adherence of the semi-conductor crystal and the aluminum and finally this aluminum layer is notched according to a well known technique similar to that used for the opening of the silicon oxide apertures.

It should be noted that the device according to the present invention was designed essentially to improve the commutating dV/dt characteristics of a triac. This is obtained according to the present invention, avoiding any migration of charges between the constitutive elements of the thyristors Th1 and Th2 at the time of switching the voltage applied from one direction into the opposite direction. At the same time, the dI/dt characteristics are improved. In addition, the conventional process for improving the non-commutating dV/dt characteristic of a triac may be used for the device according to the present invention. These processes consists in immersing the p-type bases across the n-type emitters in such a way that the contacts locally ensure short circuits between the n-type emitters and the p-type bases. In the device described, these short circuits have to be provided in the layers 24 and 25 represented in FIGS. 5–10. Other conventional processes intended to improve various characteristics of the triac may also be provided in the device described without departing from the scope of the present invention.

The present invention is not limited to the embodiments described but variants and modifications which are apparent to the person skilled in the art may be applied thereto.

What is claimed is:

1. In a bi-directional gate controlled semiconductor device of the type having first and second main electrodes and a gate electrode and comprised of a single semi-conductor body having a geometrical axis of symmetry and first and second parallel surfaces perpendicular to said axis of symmetry, said semi-conductor body including an n-type inner layer between first and second p-type outer layers defining said first and second surfaces, respectively, and forming first and second p-n junctions, respectively, with said n-type inner layer, the improvement comprising:

a. first, second and third separate $n^+$-type diffused layers on said first p-type outer layer forming third, fourth and fifth p-n junctions, respectively, with said first p-type outer layer,
   1. said first $n^+$-type layer having a substantially semi-circular shape defined by two semi-circles of first and second radii, where said first radius is greater than said second radius, said first $n^+$-type diffused layer being situated on one side only of a diametrical plane perpendicular to said first and second surfaces,
   2. said second $n^+$-type layer being C-shaped substantially centered on the axis of symmetry of the device and opening towards said first $n^+$-type layer, and
   3. said third $n^+$-type layer completely surrounding said second $n^+$-type layer, b. fourth and fifth separate $n^+$-type diffused layers on said second p-type outer layer forming sixth and seventh p-n junctions, respectively, with said second p-type outer layer,
   1. said fourth $n^+$-type layer having a substantially semi-circular shape defined by two semi-circles of said first and second radii, said fourth $n^+$-type layer being situated on the other side only of said diametrical plane opposite said first $n^+$-layer, and
   2. said fifth $n^+$-type layer having the shape of a disc with a third radius and centered on the axis of symmetry of the device, said third radius being less than said second radius, c. first, second, third, fourth and fifth ohmic contacts disposed on the semi-conductor device, 1. said first ohmic contact consisting of metallization over said entire second surface, said first ohmic contact forming one of said first and second main electrodes,
2. said second ohmic contact consisting of a circular metallization on said first surface and having an outer radius greater than said first radius and a inner radius greater than said second radius, said second ohmic contact forming the other of said first and second main electrodes,
3. said third ohmic contact consisting of a metallization on said first surface in the shape of a disc centered on the axis of symmetry of the device and having a diameter smaller than the diameter of said second $n^+$-type layer, said third ohmic contact forming said gate electrode,
4. said fourth ohmic contact consisting of a metallization on said first surface having the shape of a part of a ring situated on the same side of said diametrical plane as said first $n^+$-type layer and covering part of said fifth p-n junction on the outer edge of said third $n^+$-type layer, and
5. said fifth ohmic contact consisting of a metallization on said first surface having the shape of a part of a ring and situated on the side of said diametrical plane opposite said first $n^+$-type layer and covering part of said fifth p-n junction on the inner edge of said third $n^+$-type layer.

2. A device according to claim 1, wherein said first $n^+$-type layer and said fourth $n^+$-type layer are spaced apart from said diametrical plane by a distance of at least 0.1mm.

3. A device according to claim 2, the portion of said third $n^+$-type layer on the same side of said diametrical plane as said fourth $n^+$-type layer has an outer radius less than or equal to said second radius.

4. A device according to claim 3, wherein said third $n^+$-type layer is separated from said first $n^+$-type layer by a distance of at least 0.5mm, thereby providing between said first and third $n^+$-type layers a transversal passage for the current which creates between said second and third ohmic contacts a resistance having a value less than 10 ohms.

5. A device according to claim 4, wherein said fifth $n^+$-type layer is separated from said fourth $n^+$-type layer and said first ohmic contact short circuits on the second surface said sixth and seventh p-n junctions.

6. A device according to claim 5, wherein the projections of said fifth $n^+$-type layer and said first $n^+$-type layer on a plane parallel to said first and second surfaces of the semi-conductor body are spaced apart by a distance of at least 0.2 mm.

7. A device according to claim 6, wherein said fourth $n^+$-type layer and said first $n^+$-type layer is provided with a short circuit emitter.

8. A device according to claim 7, wherein said third ohmic contact covers part of said fifth p-n junction on the inner edge of said second $n^+$-type layer.

* * * * *